(12) United States Patent
Tsutsui

(10) Patent No.: US 7,291,969 B2
(45) Date of Patent: Nov. 6, 2007

(54) ORGANIC ELECTROLUMINESCENT DEVICE

(75) Inventor: Tetsuo Tsutsui, Fukuoka (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 46 days.

(21) Appl. No.: 10/628,701

(22) Filed: Jul. 28, 2003

(65) Prior Publication Data

US 2004/0027059 A1 Feb. 12, 2004

(30) Foreign Application Priority Data

Aug. 9, 2002 (JP) ........................ 2002-233526

(51) Int. Cl.
*H01J 1/62* (2006.01)
*H05B 33/00* (2006.01)

(52) U.S. Cl. ...................... 313/504; 313/506

(58) Field of Classification Search ............... 313/498, 313/503, 504, 506; 428/917
See application file for complete search history.

(56) References Cited

U.S. PATENT DOCUMENTS

| | | | |
|---|---|---|---|
| 5,229,310 A | 7/1993 | Sivan | |
| 5,500,537 A | 3/1996 | Tsumura et al. | |
| 5,648,181 A * | 7/1997 | Watanabe | 428/689 |

(Continued)

FOREIGN PATENT DOCUMENTS

| | | |
|---|---|---|
| DE | 19854938 A1 | 6/2000 |
| EP | 1 339 112 A2 | 8/2003 |
| JP | 55-140277 | 11/1980 |

(Continued)

OTHER PUBLICATIONS

Shirakawa, H. et al, "Synthesis of Electrically Conducting Organic Polymers: Halogen Derivatives of Polyacetylene, (CH)x," J.C.S. Chem. Comm., No. 16, pp. 578–580 (1977).
Tang, C.W. et al, "Organic Electroluminescent Diodes," Appl. Phys. Lett., vol. 51, No. 12, pp. 913–915, Sep. 21, (1987).
Tsutsui, T., "The Operation Mechanism and the Light Emission Efficiency of the Organic EL Element," Textbook of the $3^{rd}$ seminar at Division of Organic Molecular Electronics and Bioelectronics, The Japan Society of Applied Physics, pp. 31–37, (1993).
Sato, Y., "Problem for Implementation in View of Materials Development," The Japan Society of Applied Physics/Organic Molecular Electronics and Bioelectronics, vol. 11, No. 1, pp. 86–99 with English abstract, (2000).
Kido, J. et al, "High Quantum Efficiency Organic EL Devices Having Charge Generation Layer," Extended Abstracts ($49^{th}$ Spring meeting, 2002), The Japan Society of Applied Physics and Related Societies, No. 3, abstract 29p–YL–3, p. 1308, Mar. (2002).
Herrmann, M. et al, "$49^{th}$ Japan Society of Applied Physics and Related Societies," p. 1308, 27p–YL–3, Mar. (2002). (Japanese reference previously submitted).
European Search Report (Application No. 03016830.6), dated Apr. 16, 2007.

*Primary Examiner*—Ashok Patel
(74) *Attorney, Agent, or Firm*—Cook, Alex, McFarron, Manzo, Cummings & Mehler, Ltd.

(57) ABSTRACT

An organic electroluminescence device of the present invention adapts a new concept in its configuration to improve its efficiency in addition to obtain a high reliability and good yielding. The organic electroluminescent device having an electroluminescent film containing an organic material capable of causing an electroluminescence and being arranged between a first electrode and a second electrode, includes: a carrier generation layer, which is a floating electrode, is embodied in the electroluminescent film; an insulting film between the first electrode and the electroluminescent film, and an insulating film between the second electrode and the electroluminescent film, wherein the organic electroluminescent device is driven by an alternating current bias.

10 Claims, 9 Drawing Sheets

U.S. PATENT DOCUMENTS

| | | |
|---|---|---|
| 5,821,690 A | 10/1998 | Martens et al. |
| 5,837,391 A | 11/1998 | Utsugi |
| 5,858,561 A | 1/1999 | Epstein et al. |
| 5,955,835 A * | 9/1999 | Oh et al. .................. 313/503 |
| 5,965,063 A | 10/1999 | Agata et al. |
| 6,255,774 B1 | 7/2001 | Pichler |
| 6,340,789 B1 | 1/2002 | Petritsch et al. |
| 6,414,432 B1 | 7/2002 | Hieda et al. |
| 6,559,375 B1 | 5/2003 | Meissner et al. |
| 6,614,176 B2 | 9/2003 | Kim et al. |
| 6,740,938 B2 | 5/2004 | Tsunoda et al. |
| 6,759,145 B2 * | 7/2004 | Lin et al. .................. 428/690 |
| 6,812,399 B2 | 11/2004 | Shaheen et al. |
| 6,872,472 B2 | 3/2005 | Liao et al. |
| 2002/0027416 A1 * | 3/2002 | Kim et al. ................ 313/506 |
| 2002/0074935 A1 | 6/2002 | Kwong et al. |
| 2002/0180349 A1 | 12/2002 | Aziz et al. |
| 2003/0127967 A1 | 7/2003 | Tsutsui et al. .............. 313/498 |
| 2003/0159729 A1 | 8/2003 | Shaheen et al. |
| 2004/0027061 A1 | 2/2004 | Seo et al. .................. 313/504 |
| 2005/0029933 A1 | 2/2005 | Liao et al. |
| 2006/0091797 A1 | 5/2006 | Tsutsui et al. |

FOREIGN PATENT DOCUMENTS

| | | |
|---|---|---|
| JP | 06-260286 | 9/1994 |
| JP | 11-329749 | 11/1999 |
| JP | 2001-313180 | 11/2001 |
| JP | 2003-045676 | 2/2003 |
| JP | 2004-39617 | 2/2004 |
| WO | WO 95/06400 A1 | 3/1995 |
| WO | WO-1996/026830 | 9/1996 |
| WO | WO 99/03158 A1 | 1/1999 |
| WO | WO 99/39372 A2 | 8/1999 |
| WO | WO 99/49525 A1 | 9/1999 |
| WO | WO 01/84644 A1 | 11/2001 |

* cited by examiner

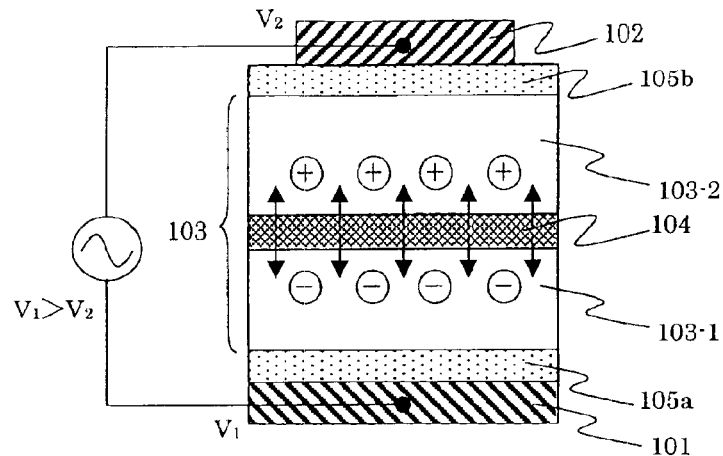
F I G. 4A
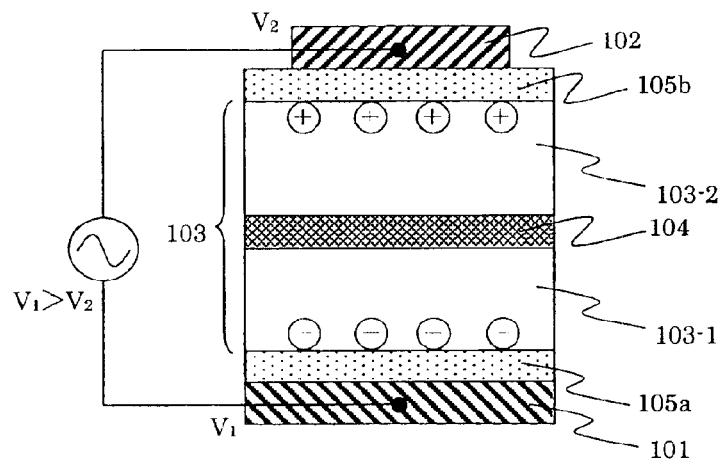
F I G. 4B
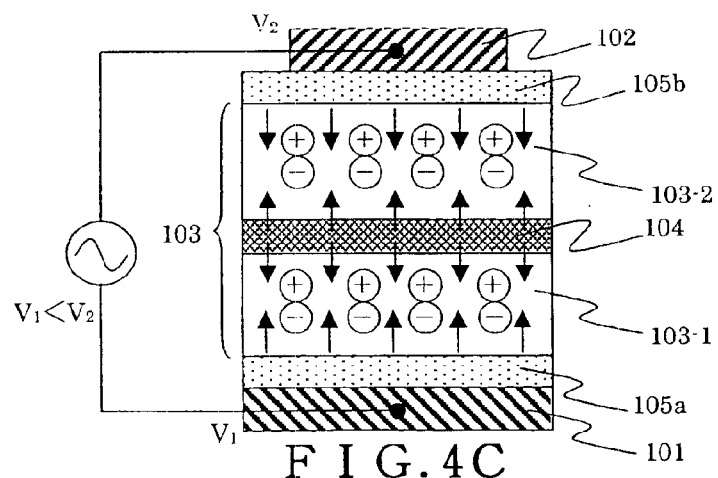
F I G. 4C

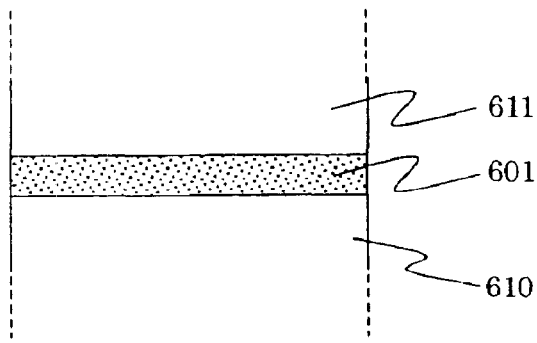
F I G. 6 A
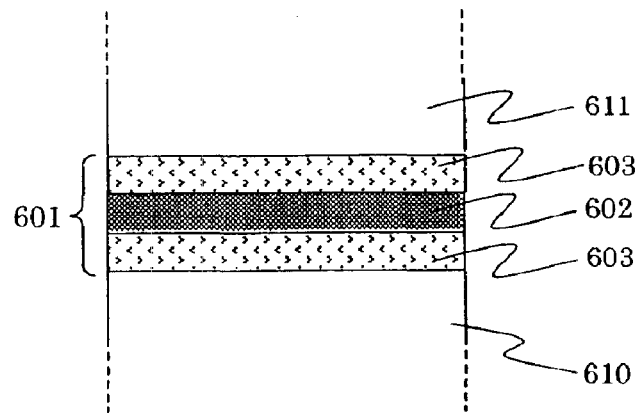
F I G. 6 B
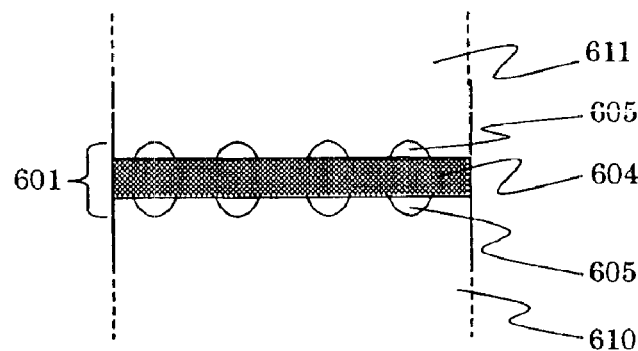
F I G. 6 C

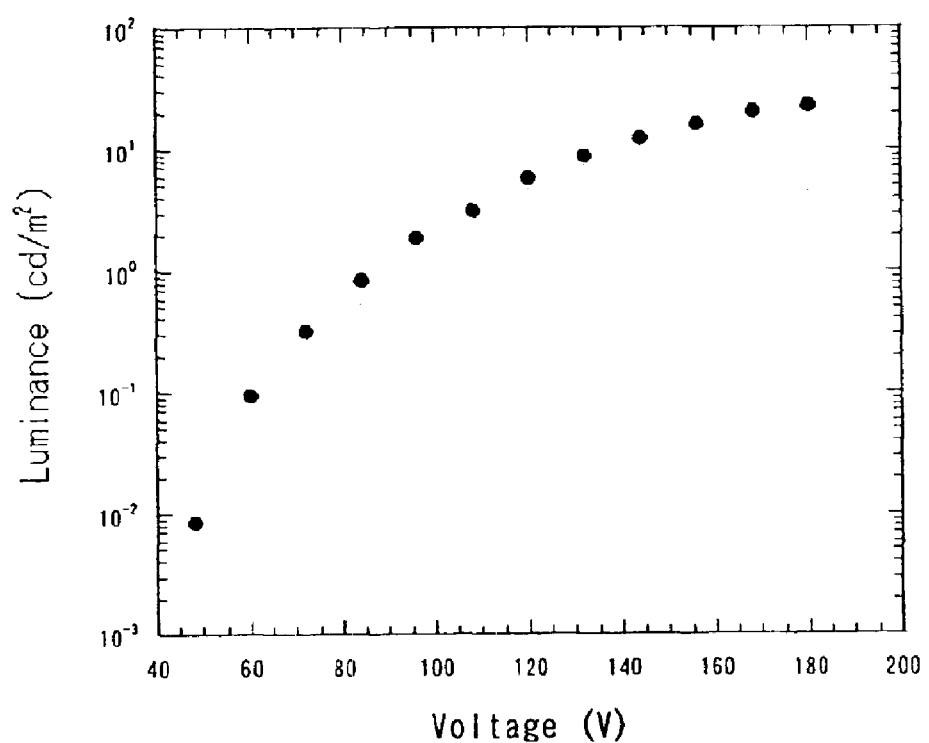
FIG. 8 relationship between voltage and luminance in Embodiment 4

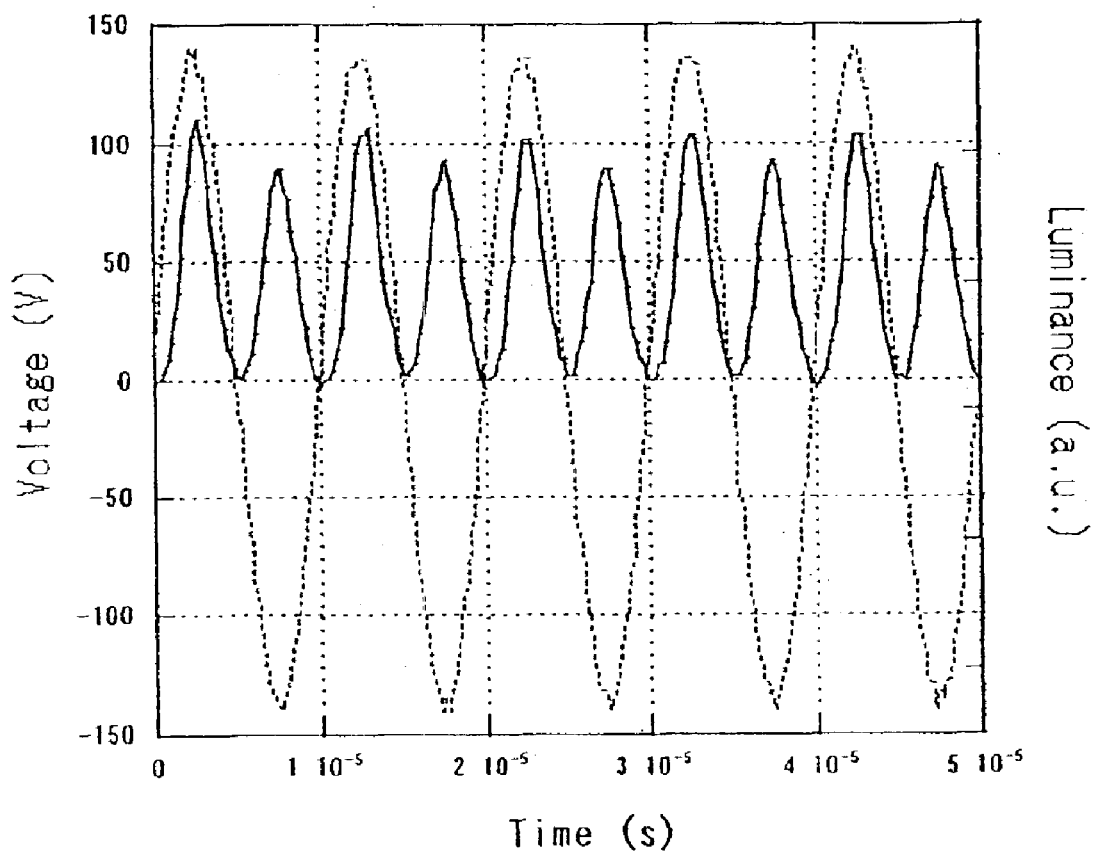
FIG. 9 AC drive characteristics in Embodiment 4

ORGANIC ELECTROLUMINESCENT DEVICE

BACKGROUND OF THE INVENTION

1. Field of the Invention

The present invention relates to an organic electroluminescent device, having an organic compound layer that generates light upon application of an electric field. More particularly, the present invention relates to an organic electroluminescent device that emits light using alternating current bias.

2. Description of the Related Art

Compared to inorganic compounds, organic compounds have more various material systems and possibilities for synthesizing organic materials to have advanced various functions through appropriate molecular design. Further, things made from the organic compound have characteristics of being flexible, and moreover, having workability by polymerization. In light of these advantages, in recent years, the technique of photonics and electronics employing functional organic materials have been attracted attention.

The technique of photonics utilizing optical properties of organic materials has already played an important role in contemporary industrial technology. For example, photosensitive materials such as a photoresist have become indispensable for a photolithography technique that is used for the micro machining of semiconductors. In addition, since the organic compounds themselves have properties of light absorption and light emission caused by the light absorption (fluorescence or phosphorescence), they are also well suited to light emitting materials for laser pigments or the like.

On the other hand, since organic compounds do not have carriers themselves, they have essentially superior insulation properties. Therefore, with respect to the technique of electronics using electrical properties of organic materials, the almost organic compounds have been conventionally used as insulators such as insulating materials, protective materials, or covering materials.

However, there is means for applying large amounts of current to the organic material that is essentially insulators. The means is increasingly coming into practical use in the electronics field. It can be broadly divided into two categories.

One of the means, as represented by conductive polymers, is that an acceptor (electron acceptor) or a donor (electron donor) is doped to give carriers to the π-conjugate system organic compound (Reference 1: Hideki Shirakawa, Edwin J. Louis, Alan G. MacDiarmid, Chwan K. Chiang, and Alan J. Heeger, "Synthesis of Electrically Conducting Organic Polymers: Halogen Derivatives of Polyacetyrene, (CH)x", Chem. Comm., 1977, 16, 578–580). Since the carriers expand to a certain area with increased the amount of doping, the dark conductivity will also rise along with this, so that large amounts of current will become flow in the organic material.

A part of the means for applying current to the organic material by doping an acceptor or a donor to improve the dark conductivity has already been applied in the electronics field, for example, a rechargeable secondary battery using polyaniline or polyacene, or an electric field condenser using polypyrrole.

The other means for applying large amounts of current to the organic material is utilization of an SCLC (Space Charge Limited Current). The SCLC is the current that starts to flow by injecting and transferring a space charge from the outside. The current density of the SCLC is expressed by Child's Law, i.e., Formula 1 in the following. In the formula, J denotes current density, $\epsilon$ denotes relative permittivity, $\epsilon_0$ denotes permittivity of vacuum, $\mu$ denotes carrier mobility, V denotes a voltage, and d denotes a distance to which the voltage V is applied:

$$J = 9/8 \cdot \epsilon \epsilon_0 \mu \cdot V^2 / d^3 \qquad \text{Formula 1}$$

Note that Formula 1 that expresses the SCLC does not assume at all carrier-trap generated when the SCLC flows. The electric current limited by carrier-trap is referred to as TCLC (Trap Charge Limited Current) and in proportion to power of the voltage. The rate of both SCLC and TCLC are determined by bulk. Therefore the SCLC is regarded the same as TCLC hereinafter.

Here, for comparison, the current density when Ohm current flows according to Ohm's Law is shown in Formula 2. $\sigma$ denotes a conductivity, and E denotes an electric field strength:

$$J = \sigma E = \sigma \cdot V/d \qquad \text{Formula 2}$$

In Formula 2, since the conductivity $\sigma$ is expressed as $\sigma = ne\mu$ (where n denotes a carrier density, and e denotes an electric charge), the carrier density is included in the factors controlling the amount of current. Therefore, unless increase of the carrier density by doping as described above is attempted to an organic material having a certain degree of carrier mobility, the Ohm current will not flow in the organic material in which carriers hardly exist usually.

However, as shown in Formula 1, the determination factors of SCLC are the permittivity, the carrier mobility, the voltage, and the distance to which the voltage is applied. The carrier density is irrelevant. In other words, it is possible to inject a carrier from the outside and to apply the current to the organic material even an organic material is an insulator having no carriers by making the distance d sufficiently small and by using a material having significant carrier mobility $\mu$.

When this means is used, the amount of current in the organic material is as much as or more than that of a common semiconductor. Thus, an organic material with high carrier mobility $\mu$, in other words, an organic material capable of transporting potentially a carrier, can be referred to as an "organic semiconductor".

Incidentally, organic electroluminescent devices (hereinafter, organic EL devices) achieve a striking prosperity in recent years as photoelectronic devices which utilize both photonics and electrical qualities of functional organic materials among organic semiconductor devices which use the SCLC.

The most basic structure of the organic EL device was reported by W. Tang, et al. in 1987 (Reference 2: C. W. Tang and S. A. Vanslyke, "Organic electroluminescent diodes", Applied Physics Letters, Vol. 51, No. 12, 913–915 (1987)).

The device reported in Reference 2 is a type of diode element in which electrodes sandwich an organic thin film to have a total thickness of approximately 100 nm that is formed by laminating a hole-transporting organic compound and an electron-transporting organic compound. For the electron-transporting compound, a light emitting material (fluorescent material) is used. By applying voltage to the device, light-emission can be extracted to outside as a light emitting diode.

The light-emission mechanism is considered as follows. By applying the voltage to the organic thin film sandwiched by the electrodes, the hole and the electron injected from the electrodes are recombined inside the organic thin film, and formed to be an excited molecule (hereinafter, referred to as a "molecular exciton"), and then, light is emitted when this molecular exciton returns to its base state.

Note that, singlet and triplet excitons formed by the organic compound can be utilized. Since the base state is normally the singlet state, the light emission from the singlet excited state is referred to as fluorescent light, and the light emission from the triplet excited state is referred to as phosphorescent light. In this specification, the light emission from either excited states will be described.

In the above-described organic EL device, the organic thin film is normally formed into a thin film to have a thickness of about 100 to 200 nm. Further, since the organic EL device is a self-luminous device in which light is generated in the organic thin film itself, a backlight that is used in a conventional liquid crystal display is not necessary. Therefore, the organic EL device has a great advantage of being able to be manufactured to be ultrathin and lightweight.

Further, in the thin film having a thickness of about 100 to 200 nm, for example, the amount of time for injecting and recombining of carriers is approximately several tens of nanoseconds taking into consideration of the carrier mobility of the organic thin film. Even if the process of carrier's recombination and light emission, light emission can be achieved within on the order of microseconds. Therefore, extremely quick response time can be included in advantages of the organic thin film.

Because of the above-mentioned properties of thin and lightweight, the quick response time, and the like, the organic EL device is attracted an attention as a next generation flat panel display device. Further, since the organic EL display has a high level of visibility from its property of self-luminous and a broad visible range, the organic EL device is expected to be used for display screens of portable devices.

An organic EL device is the device that utilizes means of applying SCLC to an organic semiconductor, but the SCLC intensifies the deterioration of the organic semiconductor function. As to the organic EL device, it is known that the device lifetime (half-life of the luminance) is reduced inversely proportional to the initial luminance, in other words, the amount of current flowing. (Reference 3: Yoshiharu SATO, "The Japan Society of Applied Physics/Organic Molecular Electronics and Bioelectronics", vol. 11, No. 1 (2000), 86–99).

In view of the foregoing, above-mentioned deterioration can be reduced by improving the current efficiency (luminance generating depending on the electric current), since the necessary amount of electric current to achieve a certain luminance can be reduced. Thus, the current efficiency is an important factor for an organic device in view of the device lifetime, not to mention the power consumption.

However, an organic EL device has a problem with respect to the current efficiency. As mentioned above, the light emission mechanism of the organic EL device is that light is converted by recombination of the injected hole and electron with each other. Therefore, in theory, it is possible to extract at most one photon from the recombination of one hole and one electron, and it is impossible to extract a plurality of photons therefrom. That is, the internal quantum efficiency (the number of emitted photons depending on injected carriers) should be at most 1.

However, in reality, it is difficult even to bring the internal quantum efficiency close to 1. For example, in the case of the organic EL device using the fluorescent material as the luminant, the statistical generation ratio of the singlet excited state (S*) and the triplet excited state (T*) is considered to be S*:T*=1:3. Therefore, the theoretical limit of the internal quantum efficiency is 0.25. (Reference 4: Tetsuo TSUTSUI, "Textbook of the 3rd seminar at Division of Organic Molecular Electronics and Bioelectronics, The Japan Society of Applied Physics" (1993), 31–37). Furthermore, as long as the fluorescent quantum yield from the fluorescent material is not $\phi_f$, the internal quantum efficiency will be decreased even lower than 0.25.

In recent years, there has been an attempt to bring the theoretical limit of the internal quantum efficiency close to 0.75 to 1 by using phosphorescent materials obtained from the light emission of the triplet excited state. The internal quantum efficiency has been actually achieved exceeding that of the fluorescent material. However, the range of material choice is unavoidably restricted since a phosphorescent material having high phosphorescent quantum efficiency $\phi_p$ should be used. That is caused by that the organic compounds that can release phosphorescent light at room temperature are extremely scarce.

For this reason, as a means for improving the inferiority of the current efficiency of a device, the concept of a charge generation layer was reported in recent years (Reference 5: M. Herrmann, Junji KIDO, "49th Japan Society of Applied Physics and Related Societies" p. 1308, 27p-YL-3 (March 2002)).

The concept of a charge generation layer is described as illustrated in FIGS. 7A–B. FIGS. 7A–B are frame formats of the organic EL device disclosed in Reference 5 that is formed by laminating an anode, an first electroluminescent layer, a charge generation layer, a second electroluminescent layer, and a cathode. Note that the electroluminescent layer (hereinafter, an EL layer) is a layer including an organic compound that can emit light by injecting carriers. In addition, the charge generation layer does not connect to an external circuit and serves as a floating electrode.

In such an organic EL device, when voltage V is applied to the region between the anode and the cathode, electrons are injected to the first EL layer from the charge generation layer and holes are injected to the second EL layer from the charge generation layer, respectively. When seen from the external circuit, holes are moving from the anode to the cathode and electrons are moving from the cathode to the anode (FIG. 6A). However, it can be also seen that both holes and electrons from the charge generation layer are moving in the reverse direction (FIG. 6B), so that carriers are recombined in both of the first EL layer and the second EL layer, and light is generated. In that case, if the current I is flowing, both of the first EL layer and the second EL layer can release photons depending on the amount of current I, respectively. Therefore, such organic EL device have the advantage of releasing two times amount of light by the same amount of current compared to an organic EL device having only one layer. (However, two times or more amount of voltage is needed compared to the organic EL device having only one layer).

In the organic EL device employing such a charge generation layer, the current efficiency can be improved significantly by laminating a number of EL layers. (However, the structure requires several times or more amount of voltage). Thus, in theory, the device lifetime can be expected to be improved along with the improvement of the current efficiency.

However, when the current efficiency is tried to be improved using a charge generation layer, it is required that a number of EL layers should be laminated and the fabricating process become complicated. Accordingly, the partial defect possibility such as a pinhole is increased. Therefore another defects such as the dispersion of each element, the short-circuit of elements, and the like are apt to be caused. That is, the problem may be occurred with the yield of devices though the essential reliability of the device is improved according to improving the current efficiency.

SUMMARY OF THE INVENTION

The inventor of the present invention considered in his dedicated study the means that can solve above-mentioned problems by improving the organic EL device including a charge generation layer (the inventor of the present invention refers to the charge generation layer as a bipolar carrier generation layer). The basic structure thereof is illustrated in FIG. 1.

FIG. 1 is an organic EL device comprises an electroluminescent film 103 between a first electrode 101 and a second electrode 102. The electroluminescent film 103 contains an organic compound capable of causing an electroluminescence. In the organic EL device, a bipolar carrier generation layer 104 provided as a floating electrode is embodied in the electroluminescent film 103, an insulating layer 105a (a first insulating layer) is formed between the first electrode 101 and the electroluminescent film 103. In addition, another insulating layer 105b (a second insulating layer) is formed between the second electrode 102 and the electroluminescent film 103. In the case shown in FIG. 1, the bipolar carrier generation layer 104 is only provided as a single layer. Thus, the electroluminescent film 103 is divided into a first electroluminescent layer 103-1 and a second electroluminescent layer 103-2 through the bipolar carrier generation layer 104. The whole structure of the electroluminescent film 103 is sandwiched between the insulating layer 105a and the insulating layer 105b.

By the way, the organic EL device shown in FIG. 1 has only one bipolar carrier generation layer 104. Alternatively, it may have two or more bipolar carrier generation layers. For instance, as shown in FIG. 2, the organic EL device may be constructed of electroluminescent layers 103-1 to 103-n and bipolar carrier generation layer 104-1 to 104-m (wherein m denotes an integer number of 1 or more, and n=m+1), which are arranged in an alternate manner.

At this time, in the organic EL device shown in FIGS. 1 and 2 can be designed such that the insulating layers are thickened sufficiently to prevent carrier injections respectively from the first and second electrodes. In this case, the organic EL device is activated by an AC drive as the carriers are injected only from the bipolar carrier generation layer. In this case, therefore, a short circuit of the device can be prevented very effectively and the device excellent in a yield or drive stability can be offered.

In a first aspect of the present invention, therefore, an organic electroluminescent device having a first electrode, a second electrode, and an electroluminescent film containing an organic compound capable of causing an electroluminescence and being arranged between the first electrode and the second electrode, comprises: a bipolar carrier generation layer, which is a floating electrode, is embedded in the electroluminescent film; an insulting film between the first electrode and the electroluminescent film, which prevents a carrier injection from the first electrode to the electroluminescent film; and an insulating film between the second electrode and the electroluminescent film, which prevents a carrier injection from the second electrode to the electroluminescent film.

In a second aspect of the present invention, an organic electroluminescent device having an electroluminescent film containing an organic compound capable of causing an electroluminescence and being arranged between a first electrode and a second electrode, comprises: a bipolar carrier generation layer, which is a floating electrode, is embodied in the electroluminescent film; an insulting film between the first electrode and the electroluminescent film; and an insulating film between the second electrode and the electroluminescent film, wherein the organic electroluminescent device is driven by an alternating current bias.

Furthermore, considering that the organic electroluminescent device is driven by an alternating current bias, the electroluminescent film may preferably contain a layer having bipolar property. Alternatively, the electroluminescent film includes an organic compound having electron-transporting property and an organic compound having hole-transporting property in combination with each other to form a bipolar mixed layer. By the way, the organic compound having bipolar property may be preferably a high molecular compound having a π-conjugated system or a σ-conjugated system on the ground of simply forming a film.

Furthermore, as a bipolar carrier generation layer, from the point of transparency, it is preferable to contain an organic compound. In this case, for expressing a high function as a bipolar carrier generation layer, it is preferable to contain at least one of an acceptor or a donor. More preferably, both the acceptor and donor for the organic compound may be contained in the bipolar carrier generation layer.

In the organic EL device of the present invention, the bipolar carrier generation layer should have sufficient carrier. Therefore, in another aspect of the present invention, the organic electroluminescent device may comprise the bipolar carrier generation layer having an electric conductivity of $10^{-10}$ S/m or more.

BRIEF DESCRIPTION OF THE DRAWINGS

FIGS. 4A–C are views showing working mechanismss;

FIGS. 6A–C are views showing examples of structures of bipolar carrier generation layers;

FIG. 8 is a view showing a relationship between voltage and luminance in Embodiment 4; and FIG. 9 is a view showing AC drive characteristics in Embodiment 4.

DESCRIPTION OF THE PREFERRED EMBODIMENTS

Hereinafter, embodiments of the present invention will be described in detail while giving the working mechanism of and concrete configuration. Here, in an organic electroluminescent device (hereinafter, simply referred to as an organic EL device), one of two electrodes may be transparent so as to extract a luminescent outside from the organic EL device. Therefore, the present invention is not only limited to the configuration of the conventional device in which a transparent electrode is formed on a substrate to extract the emission of light from the substrate side through the transparent electrode, actually, but also another configuration of the device in which the emission of light is extracted from the side opposite to the substrate, or the configuration of the device in which the emission of light is extracted from the both sides of the electrode.

Figure 1:
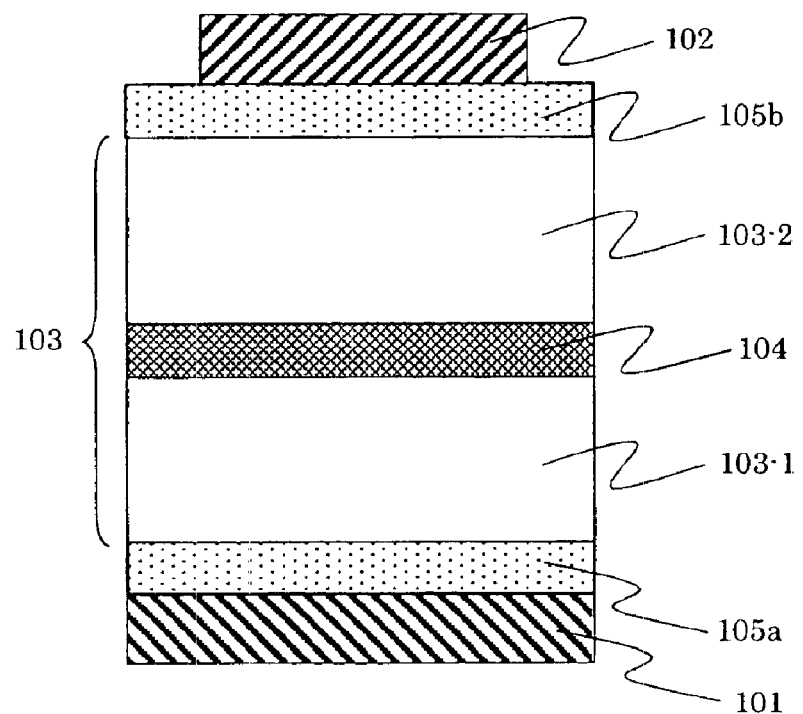
FIG. 1 is a view showing a basic structure according to the present invention.
Figure 3:
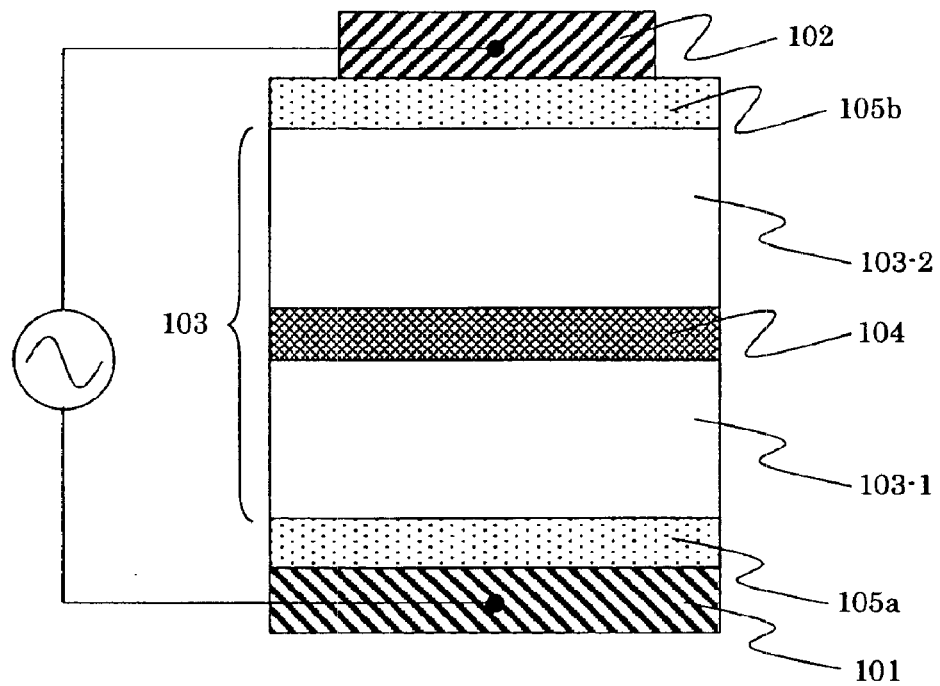
FIG. 3 is a view showing an organic EL device according to the present invention.

At first, the working mechanism of the organic EL device of the present invention will be described with reference to FIGS. 3 and 4A–C. FIG. 3 is an organic EL device of the present invention in which an AC power supply is connected to the first electrode 101 and the second electrode 102 shown in FIG. 1. In this figure, the same structural components as those of FIG. 1 are denoted by the same reference numerals as those of FIG. 1. In addition, a luminous body having bipolar property is used as each of the first electroluminescent 103-1 and the second electrode electroluminescent 103-2. Furthermore, the potential of the first electrode is defined as $V_1$ and the potential of the second electrode is defined as $V_2$.

When the device is applied with an AC voltage, at first, at the time of immediately after the application of the bias of $V_1 > V_2$, electrons move from the bipolar carrier generation 104 to the first electrode 101, while holes move toward the second electrode 102. In each case, they are finally injected into the electroluminescent film 103 (FIG. 4A).

On the other hand, as the insulating layers 105a and 105b are present, there is no chance to inject the carriers into the electroluminescent film 103 from the first electrode 101 and the second electrode 102. Therefore, the carriers injected from the bipolar carrier generation layer are not recombined, so that they will accumulate in the boundary between the insulating 105a and the electroluminescent film 103 and in the boundary between the insulating 105b and the electroluminescent film 103 (FIG. 4B), respectively.

As the voltage being applied is an alternating current bias, immediately after that, the voltage ($V_1 < V_2$) is applied on the device. At this time, from the bipolar carrier generation 104, the carriers are injected in the direction opposite to the case in FIG. 4A, while the carriers accumulated in FIG. 4B flow to the bipolar carrier generation 104 (FIG. 4C). As a result, just as in the case of the organic EL device in which the conventional bipolar carrier generation layer is used (the preliminary report for the 49th Spring Meeting of the Japan Society (March, 2002), p.1308, 27p-YL-3), the carriers are recombined in the first electroluminescent layer 103-1 and the second electroluminescent 103-2, resulting in light emission from there.

The present organic EL device is different from the device disclosed in the above non-patent reference 5 is that the injection of carriers is only performed from the bipolar carrier generation layer being embedded in the inside but not from the outside electrode as an insulating 105a and an insulating 105b, are arranged in the device. That is, only the apparent AC flows (behavior seemingly just like intrinsic EL is shown). This can protect the short circuit of the device or the like easily and it is very useful.

Furthermore, the device of the present invention does not generate leak current because of the presence of the insulating layers 105a and 105b. Therefore, it is also one of the features that improvement in efficiency is expected more.

Figure 2:
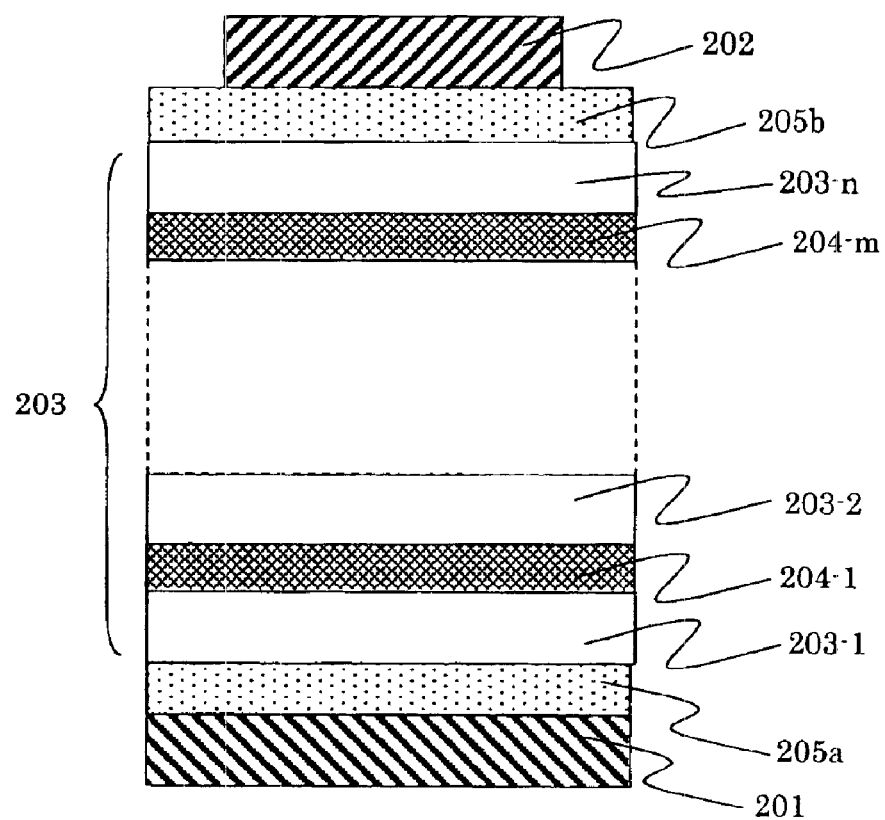
FIG. 2 is a view showing a basic structure according to the present invention.
Figure 5:
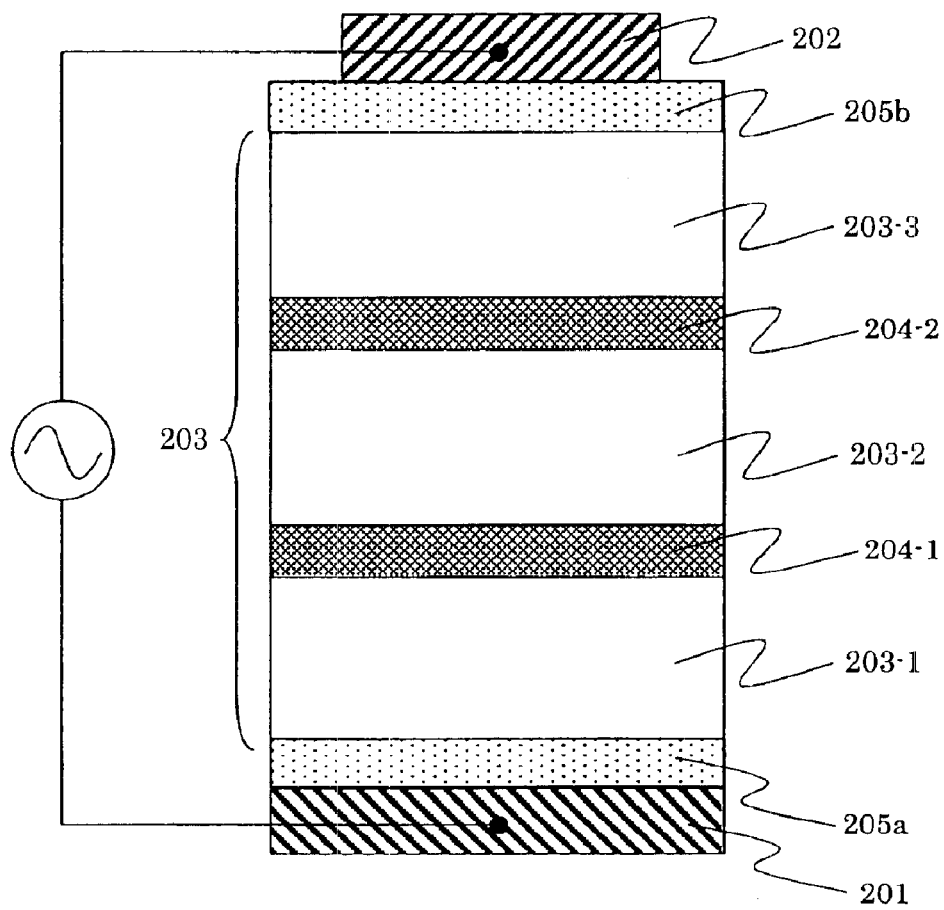
FIG. 5 is a view showing an organic EL device according to the present invention.
Figure 7A:
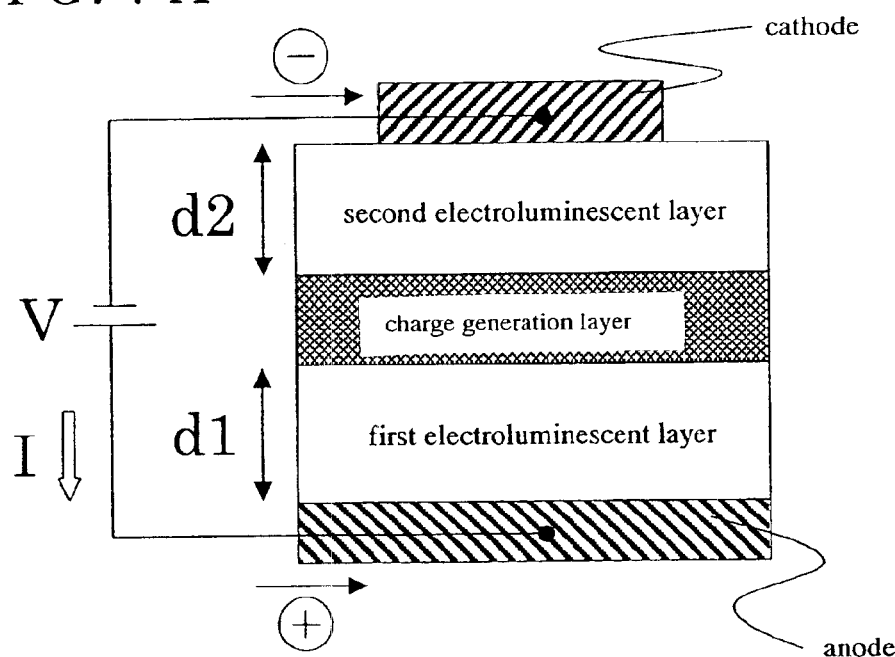
FIG. 7A and FIG. 7B are views showing organic EL device including conventional charge generation layers.
Figure 7B:
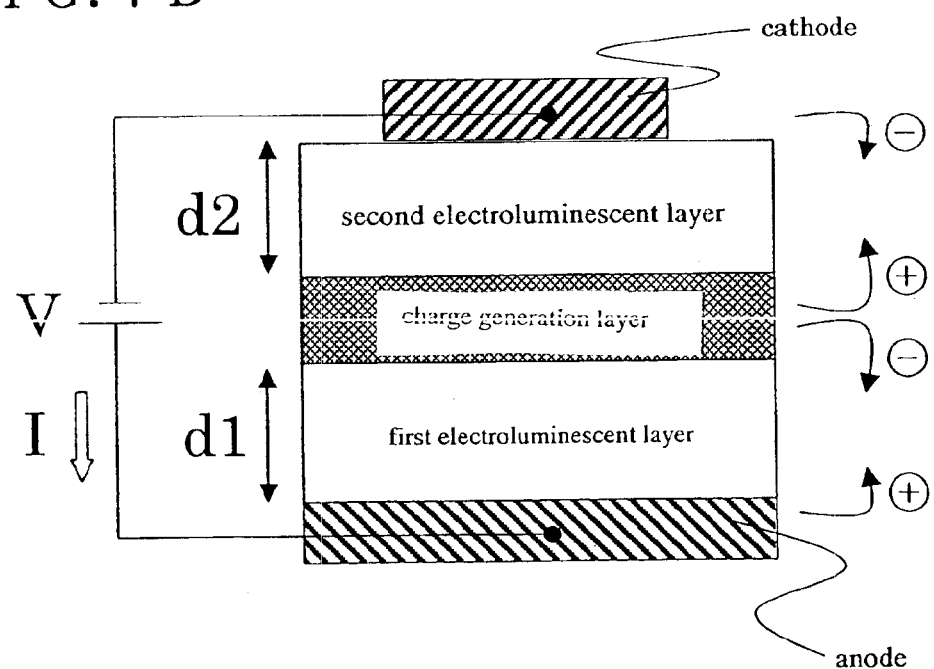

Furthermore, this invention can also be considered as a multilayer as shown in FIG. 2. The example (namely, the example in the case of m=2 and n=3) in which two bipolar carrier generation layers are inserted is shown in FIG. 5. In FIG. 5, the same reference numerals as those of FIG. 2 are used. In addition, the working mechanism of this example was substantially the same one as that of FIG. 3 or 4A–C, except of the follows. That is, firstly (the moment that bias was impressed at the unbias condition), carriers were already recombined to cause illumination in the second electroluminescent film 203-2 (on the other hand, in the device of FIG. 3 mentioned previously, carriers are only accumulated at the bias was firstly impressed).

Furthermore, the waveform of the above described alternating current bias may be preferably sine wave, square wave, and triangle wave. However, the present invention is not limited to these waveforms. The maximum voltage may be preferably 300 Volts or less.

In the above description, the principle of operation of this invention was described. In the following description, we will describe the preferable configurations of the bipolar carrier generation layer to be used in the present invention and the preferable configuration of the electroluminescent film. However, the present invention is not limited to such a configuration.

The bipolar carrier generation layer may be, for example, a metal thin film, a metal-oxide thin film, an organic conductive thin film, or a combination thereof. For instance, in the non-patent reference 5, there is disclosed a laminate prepared by laminating a metal oxide (ITO) on an organic conductive thin film (Cs-doped BCP). In addition, on the both sides of the bipolar carrier generation layer, an inorganic dielectric thin film such as LiF, a metal oxide such as Li oxide, an alkali metal or an organic thin film layer including alkaline earth metal ion, or the like is provided as a cathode-side buffer layer. On the other hand, as an anode-side buffer layer, copper phthalocyanine may be used.

Furthermore, if it takes into consideration that the element of the present invention is driven by an alternating current bias, the bipolar carrier generation layer should be designed such that both carriers of holes and electrons can be injected. One of examples of such a configuration is shown in FIGS. 6A–C.

As shown in FIG. 6A, when the bipolar carrier generation 601 is formed from a single material, a semiconductor (e.g., an intrinsic semiconductor) having a wide band gap in which electrons are located in a conductor and holes are located in a valence band, a redox polymer which can perform both oxidation and reduction can be considered. In addition, the reference numerals 610 and 611 in FIGS. 6A–C denote electroluminescent layers.

The concrete examples of the semiconductors having wide band gaps include III-group-N compounds such as GaN, AlN, BN, AlGaN, InGaN, and InAlGaN, II–VI group compounds ZnS, MgS, ZnSe, MgSe, ZnMgSSe, CdS, ZnO, and BeO, diamond, SiC, ZnGaSSe, $CaF_2$, and AlP. Furthermore, redox polymers include emeraldine base polyaniline (EB-PAni).

Here, as a bipolar carrier generation 601, it is effective to use an organic conductive body. For instance, there is a means for mixing a p-type organic semiconductor and an n-type organic semiconductor. The representative examples of the p-type organic semiconductor may include, for example, copper phthalocyanine (abbrev., CuPc) having the following structural formula (1), and other metal phthalocyanine, non-metal phthalocyanine, or the like may be applied. The representative examples of the n-type organic semiconductor may include, for example, $F_{16}$-CuPC or the like represented by the following structural formulas (2), or 3,4,9,10-perylene tetra-carboxylic acid derivatives or the like represented by the general formulas (3) (abbrev., PV), (4) (abbrev., Me-PTC), and (5) (abbrev., PTCAD).

[Chemical Formula 1]
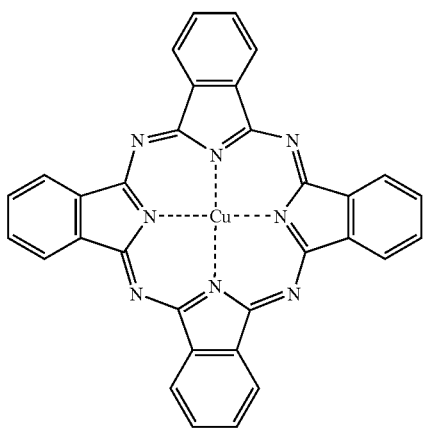

[Chemical Formula 2]
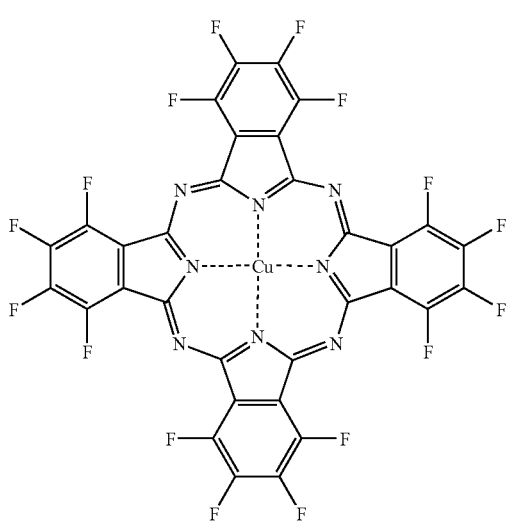

[Chemical Formula 3]
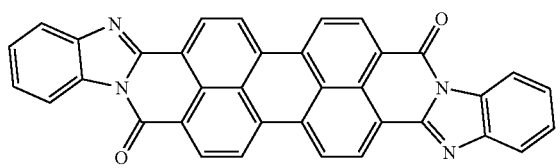

[Chemical Formula 4]
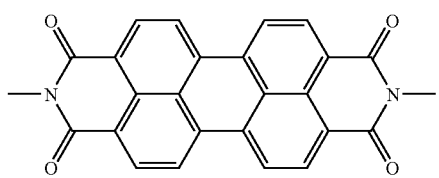

[Chemical Formula 5]
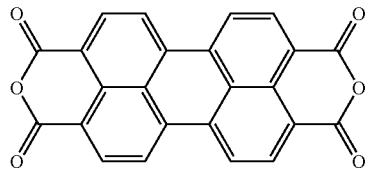

Furthermore, there is another method using an organic conductor having conductivity by preparing a charge-transfer complex as a mixture of the acceptor (electron acceptor) of the organic compound and the donor (electron donor) of the organic compound. The charge transfer complexes tend to be crystallized and some of them show poor film formability. However, since the bipolar carrier generation layer of the present invention may be formed in the shape of a thin layer or a cluster (so that carriers can be injected), there is no substantial problem.

A representative example of the acceptor is TCNQ or a derivative thereof represented by the structural formula (6) below or a nickel complex represented by the structural formula (7) below. In addition, a typical example of the donor is a TTF or a derivative thereof represented by the structural formula (8).

[Chemical Formula 6]
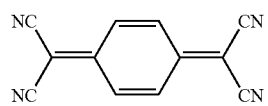

[Chemical Formula 7]
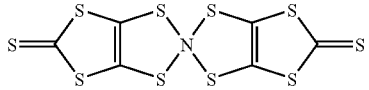

[Chemical Formula 8]
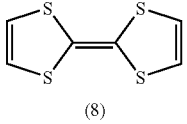

(8)

As another example of the organic conductor, there is a technique of imparting a dark conductivity to an organic semiconductor by doping with an acceptor or a donor. As an organic semiconductor, an organic compound having a ŏ-conjugated system, as exemplified by a conductive high polymer, may be used. Furthermore, in addition to the examples described above, the acceptor may be a Lewis acid such as iron(III) chloride or a halogen compound (the Lewis acid can serve as an acceptor). As the donor, in addition to the examples described above, a Lewis base such as an alkali metal or an alkaline earth metal may be used (a Lewis base can serve as a donor).

Although the example that constitutes a bipolar carrier generation layer from a single layer was described above. More preferably, there is another technique of constituting a bipolar carrier generation layer from two or more materials, for example, as shown in FIG. 6B and FIG. 6C.

FIG. 6B illustrates the configuration in which a bipolar carrier generation layer 601 is constructed such that a conductive film 602 is sandwiched between electroluminescent layers 610 and 611 through an intrinsic semiconductor 603. In such device structure, carriers can be injected by applying either plus or minus bias thereto. Here, the intrinsic semiconductor 603 may preferably be brought into ohmic contact with the conductive film 602. Furthermore, the conductive film 602 may be a metal, or may be various kinds of inorganic compound conductors or organic conductors described above. Furthermore, instead of the intrinsic semiconductor 603, it may be a redox polymer or an organic conductor.

FIG. 6C is the configuration of the bipolar carrier generation 601 in which the cluster-like electron injection region 605 is provided in the upper and lower sides of the conductive film 604 having a large work function. Such a construction allows the injection of holes from the conductive film 604 and electrons from the electron-injection region, a carrier can be injected whichever bias. As the conduction film 604 having a large work function, ITO, Au, or the like can be considered. Alternatively, the organic conductors described above may be used. The clustered electron injecting region 605 may be formed by making the conventional electron injecting material into a cluster shape. In this case, the conventional electron injecting material may be AL:Li alloy, a metal such as Ca, an inorganic electron injecting material such as LiF, an LiF, an organic compound having a large electron affinity.

It is also possible to make the configuration of FIG. 6C reversely from one described above. That is, cluster-like hole-injecting regions 605 are formed on the upper and lower sides of the conductive film 604 having a small work function. In this case, the conductive film 604 having a small work function may be an Al:Li alloy, Ca, or one of other organic conductors as described above. The cluster-like hole-injecting region 605 may be formed by making the conventional hole-injecting material into a cluster shape. In this case, the conventional hole-injecting material may be a metal such as Au or ITO, or an inorganic compound conductor, or an organic compound having a comparatively small ionization potential.

Next, hereinafter, the configuration of the electroluminescent layer will be exemplified. Typically, the electroluminescent layer may be constructed of any structural component generally used in the organic EL device structure. However, considering the activation of the device with alternating current bias, it is preferable to form electroluminescent layer having bipolar properties.

As a method for obtaining a bipolar electroluminescent layer, one comprises the steps of mixing a hole-transporting material and an electron-transporting material to form a layer having bipolar properties. Available hole-transporting materials include aromatic-amine compounds (i.e., having benzene-ring to nitrogen bonds) which have been widely used in the art, such as 4,4'-bis(diphenyl amino)-biphenyl (abbreviated name: TAD) and derivatives thereof, 4,4'-bis[N-(3-methylphenyl)-N-phenyl-amino]-biphenyl (abbreviated name: TPD) and 4,4'-bis [N-(1-naphthyl)-N-phenyl-amino]-biphenyl (abbreviated name: a-NPD). In addition, starburst-type aromatic amine compounds such as 4,4',4"-tris (N,N-diphenyl-amino)-triphenylaminine (abbreviated name: TDATA), 4,4',4"-tris[N-(3-methylphenl)-N-phenyl-amino]-triphenylamine (abbrev., MTDATA) may be used. Furthermore, as an electron-transporting material, any of metal complexes have been generally used, such as metal complexes having quinoline skeletons or benzoquinoline skeletons including tris(8-quinolinolato) aluminum (abbrev., Alq), tris (4-methyl-8-quinolinolato) aluminum (abbrev., Almq), and bis (10-hydroxybenzo [h]-quinolinato) beryllium (abbrev., Bebq), and a mixed ligand complex such as bis (2-methyl-8-quinolinolato)-(4-hydroxy-biphenyl)-aluminum (abbrev., BAlq). Furthermore, metal complexes having oxazole or thiazole ligands such as zinc bis[2-(2-hydroxyphenyl)-benzoxazorato] (abbrev., $Zn(BOX)_2$), and zinc bis[2-(2-hydroxyphenyl)-benzothiazorato] (abbrev., $Zn(BTZ)_2$) Furthermore, in addition to the metal complexes, materials having electron-transporting properties include oxadiazol derivatives such as 2-(4-biphenyl)-5-(4-tert-buthylphenyl)-1,3,4-oxadiazole (abbrev., PBD) and 1,3-bis [5-(p-tert-butylphenyl)-1,3,4-oxadiazole-2-il] benzene (abbrev., OXD-7), triazole derivatives such as 3-(4-tert-butylphenyl)-4-phenyl-5-(4-biphenyl)-1,2,4-triazole (abbrev., TAZ), 3-(4-tert-butylphenyl)-4-(4-ethypheny)-5-(4-biphenylyl)-1,2,4-triazole (abbrev., p-EtTAZ), and phenanthroline derivatives such as bathophenanthroline (abbrev., BPhen) and bathocuproine (abbrev., BCP) have an electron-transporting property.

Furthermore, many of the EL device materials using high molecular compounds show bipolar properties, so that they can be preferably used, specifically including polyparaphenylene polymers such as poly (2,5-dialkoxy-1,3-phenylene) (abbrev., RO-PPP), polyparaphenylene vinylene polymer such as poly (2,5-dialkoxy-1,4-phenylene vinylene) (abbrev., RO-PPV), and polyfluorene polymer such as poly (9,9-dialkylfluorene) (abbrev., PDAF).

As the first electrode and second electrode, any conductive material may be used. Aluminum, chromium, titanium, or the like may be used. Among them, preferably, a transparent conductive film such as ITO may be used for at least one of these electrodes for the need of transparency. In addition, as the insulating layer, an inorganic insulator such as aluminum oxide or calcium fluoride or an insulating organic material such as polyparaxylylene may be used. In this case, it is noted that at least the insulating layer on the light-emitting side should have transparency.

Color mixture of each electroluminescent layer is carried out as a different luminescent color to allow white luminescence. Furthermore, therefore, the organic EL device of the present invention will be also applicable to white luminescence with high efficiency and long device life. In addition, the application not only to display but also to lighting or the like will be also considerable.

Embodiment 1

An organic EL device of the present invention that is fabricated by the vapor deposition will be specifically described in this embodiment. First, ITO is deposited to have a thickness of 100 nm as a first electrode on a glass substrate by vapor deposition, and oxide aluminum is deposited thereon to have a thickness of 300 nm as an insulating layer by EB vapor deposition.

Next, N,N'-bis(3-methylphenyl)-N,N'-diphenyl-benzidine (abbrev., TPD) as a hole transporting material and tris (8-quinolinolato) aluminum (abbrev., Alq) as an electron transporting material are co-deposited at 1:4 weight ratio to form a bipolar first electroluminescent layer to have a thickness of 100 nm. Here, 4-dicyanomethylene-2-methyl-6-(p-dimethylaminostyryl)-4H-pyran (abbrev., DCM) as a fluorescent pigment is doped to the center portion as much as 60 nm (between 20 to 80 nm from bottom of the thickness) to have weight ratio that TPD: Alq: DCM=1:4: 0.05.

After the first electroluminescent layer is formed in such a way, metallic aluminum is formed to have a thickness of 30 nm as a bipolar carrier generation layer.

Thereafter, a second electroluminescent layer is continuously formed in exactly the same way as the first electroluminescent layer without breaking a vacuum. Moreover, oxide aluminum is deposited to have a thickness of 300 nm as an insulating layer by EB vapor deposition. Lastly, aluminum is deposited to have a thickness of 100 nm as a second electrode. Then, an organic EL device of the present invention can be formed.

Embodiment 2

An organic EL device of the present invention fabricated by wet coating will be specifically described in this embodiment. First, poly(vinyl phenol) is coated by spin coating to have a thickness of 200 nm as an insulating layer on the glass substrate on which ITO is formed to have approximately 100 nm in thick as a first electrode. In addition, a material for solvent is isopropanol.

Second, poly(2-methoxy-5-(2-ethyl-hexoxy)-1,4-phenylenevinylene) (abbrev., MEH-PPV) is dissolved in dichloroethane, and coated 80 nm in thick by spin coating to form a first electroluminescent layer After the first electroluminescent layer is formed in such a way, aqueous solution of poly(ethylene dioxythiophene) doped with polystyrene sulfonic acid (abbrev., PEDOT/PSS) is spin coated to form a bipolar carrier generation layer to have a thickness of 100 nm.

Thereafter, a second electroluminescent layer is continuously formed in exactly the same way as the first electroluminescent layer. Further, poly(vinyl phenol) is coated by spin coating to have a thickness of 200 nm as an insulating layer. Lastly, aluminum is formed to have a thickness of 100 nm as a second electrode. Then, an organic EL device of the present invention can be formed.

Embodiment 3

An organic EL device of the present invention fabricated by coating with polymer composite films containing luminous pigments and bonding without using vapor deposition will be specifically described in this embodiment.

First, poly(vinyl phenol) is coated by spin coating to have a thickness of 200 nm as an insulating layer on the plastic substrate (polyester substrate or polyimide substrate) on which ITO is formed 100 nm in thick as a first electrode. In addition, a material for solvent is isopropanol.

Next, dichloromethane solution prepared from 50 wt % polycarbonate as binder, 29 wt % TPD as a hole transporting material, 20 wt % 2,5-bis(1-naphthyl)-1,3,4-oxadiazole (abbrev., BND) as an electron transporting material, 1.0 wt % coumarin 6 as a luminous pigment is spin coated on the insulating layer to form a first electroluminescent layer to have 100 nm in thick.

After the first electroluminescent layer is formed in such a way, polyaniline doped with camphor-10-sulfonic acid (abbrev., PAni(CSA)$_{0.5}$) is formed as a bipolar carrier generation layer to have a thickness of 50 nm by spin-coating 1,1,1,3,3,3-hexafluoro-2-propanol (abbrev., HFIP) solution of PAni(CSA)$_{0.5}$.

Then, dichloromethane solution prepared from 50 wt % polycarbonate as binder, 29 wt % TPD as a hole transporting material, 20 wt % 2,5-bis(1-naphthyl)-1,3,4-oxadiazole (abbrev., BND) as an electron transporting material, 1.0 wt % coumarin 6 as a luminous pigment is spin coated on the insulating layer to form a second electroluminescent layer to have 100 nm in thick. Hereinafter, the substrate that is executed the deposition so far is referred to as a "first electrode side substrate".

In addition to above-mentioned substrate, poly(vinyl phenol) is coated as an insulating layer to have a thickness of 200 nm on a plastic substrate on which ITO having same size is formed. Hereinafter, the substrate is referred to as a "second electrode side substrate". For the deposition of poly(vinyl phenol), isopropanol solution may be spin coated as same as the previous way.

Here, spacer film having 650 nm in thick is positioned on the periphery portion of the first electrode side substrate prepared in advance, and the second electrode side substrate is bonded to let the second electrode is inside of the substrate.

The bonded film substrate is putted on a stainless plate of a hot plate, and weighted by superimposing another stainless plate thereon, then, heated up to 80° C. as it is. The film substrate is cooled with weighting, and got it out of the stainless plate, then, fitted with a lead wiring, and then, an organic EL device of the present invention is completed.

Embodiment 4

Iso-propanol solution of poly(4-vinyl phenol) is spin coated onto an ITO glass substrate to have a thickness of 200 nm. The film is dried at 60° C. in vacuum for 30 minutes. Then, an insulating film comprising poly(4-vinyl phenol) is formed.

Next, dichloromethane solution in which polyvinylcarbazole (64.3 mol. %) as a hole transporting material, 2.5-bis(1-naphthyl)-1,3,4-oxadiazole (BND) (35.1 mol. %) as an electron transporting material, and a coumarine-6dye (0.6 mol. %) as a light emission dye are dissolved is spin coated on the insulating film to have a thickness of 200 nm, and dried at 60° C. in vacuum for 30 minutes, then, a polymer layer is formed.

On top of that, iso-propanol suspension of ITO particles (average grain diameter 50 nm) is uniformly spread by spin coating. Further, dichloromethane solution in which polyvinylcarbazole (64.3 mol. %) as a hole transporting material, 2.5-bis(1-naphthyl)-1,3,4-oxadiazole (BND) (35.1 mol. %) as an electron transporting material, and a coumarine-6dye (0.6 mol. %) as a light emission dye are dissolved is spin coated to have a thickness of 200 nm, and dried at 60° C. in vacuum for 1 hour, then, a polymer layer is formed. Iso-propanol solution of poly(4-vinyl phenol) is spin coated thereon to have a thickness of 200 nm. The film is dried at 60° C. in vacuum for 30 minutes. Then, an insulating film comprising poly(4-vinyl phenol) is formed. Lastly, an aluminium electrode is formed thereon to have a thickness of 60 nm by vapor deposition.

AC power generating sine wave is connected between the electrodes. AC voltage is applied to the electrode (the drive frequency range is 1 kHz to 100 kHz). In the case that AC voltage is applied at drive frequency 100 kHz, homogeneous green luminescence of coumarin pigments exactly with the rectangular electrode shape can be observed at voltage 60V (peak voltage) viewing from the ITO electrode side. A measurement of luminance with a luminance meter (Topcon BM-5A) shows 30 cd/m$^2$ at applied voltage 180V. When the device is continuously applied 180V, since more voltage than 180V cannot applied for limitation of AC power, the device can continuously emit light with little luminance attenuation for 1 hour. Even when the drive frequency is lowered to 1 kHz, luminance can be observed.

FIG. 8 shows a relationship between voltage (illustrated with peak voltage) at drive frequency 100 kHz and luminance. FIG. 9 shows the result of time profile of luminance strength detected using a photomultimeter measured simultaneously with applying voltage using oscilloscope. The measurement result shows that luminance is generated in synchronization with plus and minus peak voltages.

Embodiment 5

Iso-propanol solution of poly(4-vinyl phenol) is spin coated onto an ITO glass substrate to have a thickness of 200 nm. The film is dried at 60° C. in vacuum for 30 minutes. Then, an insulating film comprising poly(4-vinyl phenol) is formed.

Next, dichloromethane solution in which polyvinylcarbazole (64.3 mol. %) as a hole transporting material, 2.5-bis(1-naphthyl)-1,3,4-oxadiazole (BND) (35.1 mol. %) as an electron transporting material, and a coumarine-6dye (0.6 mol. %) as a light emission dye are dissolved is spin coated onto the insulating film to have a thickness of 200 nm, and dried at 60° C. in vacuum for 1 hour, then, a polymer composite film layer is formed.

On top of that, iso-propanol suspension of ITO particles (average grain diameter 50 nm) is uniformly spread by spin coating.

Further, dichloromethane solution in which polyvinylcarbazole (64.3 mol. %) as a hole transporting material, 2.5-bis(1-naphthyl)-1,3,4-oxadiazole (BND) (35.1 mol. %) as an electron transporting material, and a coumarine-6dye (0.6 mol. %) as a light emission dye are dissolved is spin coated thereon to have a thickness of 200 nm, and dried at 60° C. in vacuum for 1 hour, then, a polymer composite film layer is formed.

Then, the steps of spin coating iso-propanol suspension of ITO particle and spin coating dichloromethane solution for forming a polymer composite film layer are respectively repeated twice.

Iso-propanol solution of poly(4-vinyl phenol) is spin coated thereon to have a thickness of 200 nm. The film is dried at 60° C. in vacuum for 30 minutes. Then, an insulating film comprising poly(4-vinyl phenol) is formed. Lastly, an aluminium electrode is formed thereon to have a thickness of 60 nm by vapor deposition.

AC power generating sine wave is connected between electrodes. AC voltage is applied to the electrode (the drive frequency range is 1 kHz to 100 kHz). In the case that AC voltage is applied at drive frequency 100 kHz, homogeneous green luminescence of coumarin pigments exactly with the rectangular electrode shape can be observed at voltage 70V (peak voltage) viewing from the ITO electrode side. A measurement of luminance with a luminance meter (Topcon BM-5A) shows 25 cd/m$^2$ at applied voltage 180V.

Embodiment 6

All of the elements of an organic EL device according to the present invention are fabricated by wet processing using polymer composite films containing light emitting dye and bonding without using vapor deposition.

Iso-propanol solution of poly(4-vinyl phenol) is spin coated on a polyester substrate on which ITO is formed to have a thickness of 100 nm as a bottom electrode to have a thickness of 200 nm. Then, an insulating film comprising poly(4-vinyl phenol) is formed.

Next, dichloromethane solution in which polyvinylcarbazole (64.3 mol. %) as a hole transporting material, 2.5-bis (1-naphthyl)-1,3,4-oxadiazole (BND) (35.1 mol. %) as an electron transporting material, and a coumarine-6dye (0.6 mol. %) as a light emission dye are dissolved is spin coated to have a thickness of 200 nm, and dried at 60° in vacuum for 1 hour, then, a polymer composite film layer is formed.

On top of that, iso-propanol suspension of ITO particles (average grain diameter 50 nm) is uniformly spread by spin coating.

In addition to the substrate, a polyester substrate on which ITO is formed to have a thickness of 100 nm as a bottom electrode is prepared, and iso-propanol solution of poly(4-vinyl phenol) is spin coated thereon to have a thickness of 200 nm as an insulating film comprising poly(4-vinyl phenol). Further, dichloromethane solution in which polyvinylcarbazole (64.3 mol. %) as a hole transporting material, 2.5-bis(1-naphthyl)-1,3,4-oxadiazole (BND) (35.1 mol. %) as an electron transporting material, and a coumarine-6dye (0.6 mol. %) as a light emission dye are dissolved is spin coated thereon to have a thickness of 200 nm, and dried at 60° C. in vacuum for 1 hour, then, a polymer composite film layer is formed.

Two fabricated polyester substrates are bonded together to let the spin-coated materials on the substrates face each other. Then, the bonded substrate is sandwiched by two glass plates, and weighted, then, heated as it is in an oven up to 80 ° C. for 30 minutes.

AC power generating sine wave is connected between two electrodes. AC voltage is applied to the electrode (the drive frequency range is 1 kHz to 100 kHz). In the case that AC voltage is applied at drive frequency 100 kHz, homogeneous green luminescence of coumarin pigments exactly with the rectangular electrode shape can be observed at voltage 60V (peak voltage) viewing from the ITO electrode side. In this case, luminescence of same luminance can be observed from both top and bottom surfaces. Even if the substrate is bended, there is no luminance transition.

According to the present invention, the current efficiency can be improved and an organic EL device having good yields, high reliability, and high can be provided.

What is claimed is:

1. An organic electroluminescent device comprising:
   a first electrode;
   a second electrode; and
   an electroluminescent film containing an organic compound capable of causing an electroluminescence and being provided between the first electrode and the second electrode,
      wherein a carrier generation layer is embodied in the electroluminescent film, said carrier generation layer being a floating electrode;
      wherein a first insulting film is provided between the first electrode and the electroluminescent film, said first insulting film preventing a carrier injection from the first electrode to the electroluminescent film; and
      wherein a second insulating film is provided between the second electrode and the electroluminescent film, said second insulating film preventing a carrier injection from the second electrode to the electroluminescent film.

2. An organic electroluminescent device as claimed in claim 1,
   wherein the organic electroluminescent device is driven by an alternating current bias.

3. An organic electroluminescent device as claimed in claim 1,
   wherein the electroluminescent film includes a layer having bipolar property.

4. An organic electroluminescent device as claimed in claim 1,
   wherein the electroluminescent film includes the organic compound, the organic compound having electron-transporting property and the electroluminescent film further includes an organic compound having hole-transporting property in combination with each other to form a bipolar mixed layer.

5. An organic electroluminescent device as claimed in claim 1,
   wherein the electroluminescent film comprises a polymer having bipolar property including a π-conjugated system or a σ-conjugated system.

6. An organic electroluminescent device as described in claim 1,
   wherein the carrier generation layer contains an organic compound.

7. An organic electroluminescent device as described in claim 6,
   wherein the carrier generation layer contains at least one of an acceptor and a donor for the organic compound.

8. An organic electroluminescent device as described in claim 6,
   wherein the carrier generation layer contains both an acceptor and a donor for the organic compound.

9. An organic electroluminescent device as described in claim 1,
   wherein the carrier generation layer has an electric conductivity of $10^{-10}$ S/m or more.

10. An organic electroluminescent device as claimed in claim 1,
    wherein the electroluminescent film includes the organic compound, the organic compound having hole-transporting property and the electroluminescent film further includes an organic compound having electron-transporting property in combination with each other to form a bipolar mixed layer.

* * * * *

UNITED STATES PATENT AND TRADEMARK OFFICE
CERTIFICATE OF CORRECTION

| | | |
|---|---|---|
| PATENT NO. | : 7,291,969 B2 | Page 1 of 1 |
| APPLICATION NO. | : 10/628701 | |
| DATED | : November 6, 2007 | |
| INVENTOR(S) | : Tetsuo Tsutsui | |

It is certified that error appears in the above-identified patent and that said Letters Patent is hereby corrected as shown below:

On The Title Page:

In The Abstract:

Line 10, Change "insulting" to -- insulating --.

In The Claims:

Claim 1, Column 16, Line 12, Change "insulting" to -- insulating --.

Claim 1, Column 16, Line 14, Change "insulting" to -- insulating --.

Signed and Sealed this

Twentieth Day of May, 2008

JON W. DUDAS
*Director of the United States Patent and Trademark Office*